US010444629B2

(12) United States Patent
Zable

(10) Patent No.: US 10,444,629 B2
(45) Date of Patent: Oct. 15, 2019

(54) BIAS CORRECTION FOR LITHOGRAPHY

(71) Applicant: D2S, Inc., San Jose, CA (US)

(72) Inventor: Harold Robert Zable, Palo Alto, CA (US)

(73) Assignee: D2S, Inc., San Jose, CA (US)

( * ) Notice: Subject to any disclaimer, the term of this patent is extended or adjusted under 35 U.S.C. 154(b) by 152 days.

(21) Appl. No.: 15/631,331

(22) Filed: Jun. 23, 2017

(65) Prior Publication Data

US 2017/0371246 A1    Dec. 28, 2017

Related U.S. Application Data

(60) Provisional application No. 62/355,869, filed on Jun. 28, 2016.

(51) Int. Cl.
*G03F 7/20* (2006.01)
*G03F 1/78* (2012.01)
*H01J 37/302* (2006.01)
*H01J 37/317* (2006.01)
*G06F 19/00* (2018.01)

(52) U.S. Cl.
CPC .............. *G03F 7/2026* (2013.01); *G03F 1/78* (2013.01); *G03F 7/70441* (2013.01); *G03F 7/70616* (2013.01); *H01J 37/3026* (2013.01); *H01J 37/3177* (2013.01); *G06F 19/00* (2013.01); *H01J 2237/30461* (2013.01); *H01J 2237/31754* (2013.01); *H01J 2237/31769* (2013.01)

(58) Field of Classification Search
CPC ...... G03F 1/78; G03F 7/2026; G03F 7/70441; G03F 7/70616; H01J 37/3026; H01J 37/3177
USPC .......................................... 430/30, 296, 942
See application file for complete search history.

(56) References Cited

U.S. PATENT DOCUMENTS

| | | | |
|---|---|---|---|
| 5,847,959 | A | 12/1998 | Veneklasen et al. |
| 6,998,217 | B2 | 2/2006 | Martyniuk et al. |
| 7,034,963 | B2 | 4/2006 | Klatchko et al. |
| 2015/0347660 | A1 | 12/2015 | Platzgummer et al. |

OTHER PUBLICATIONS

E.A. Hakkennes et al, "Demonstration of Real Time pattern correction for high throughput maskless lithography," Procceedings of SPIE, vol. 7970, Jan. 1, 2011, p. 79701, XP055025755.
European Search Report dated Nov. 17, 2017 for EP Application No. 17178472.1.

*Primary Examiner* — Christopher G Young
(74) *Attorney, Agent, or Firm* — MLO, a professional corp.

(57) ABSTRACT

Methods include inputting an array of pixels, where each pixel in the array of pixels has a pixel dose. The array of pixels represents dosage on a surface to be exposed with a plurality of patterns, each pattern of the plurality of patterns having an edge. A target bias is input. An edge of a pattern in the plurality of patterns is identified. For each pixel which is in a neighborhood of the identified edge, a calculated pixel dose is calculated such that the identified edge is relocated by the target bias. The array of pixels with the calculated pixel doses is output. Systems for performing the methods are also disclosed.

12 Claims, 18 Drawing Sheets

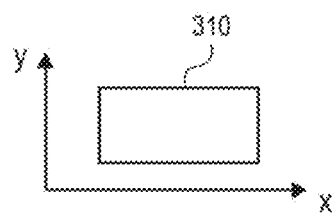
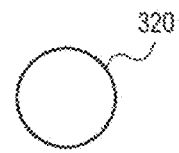
FIG. 3A  FIG. 3B
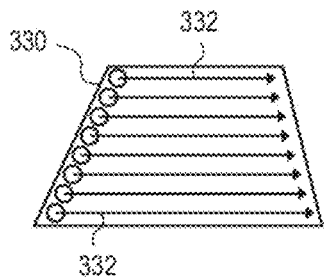
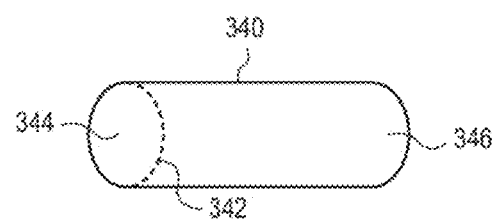
FIG. 3C  FIG. 3D
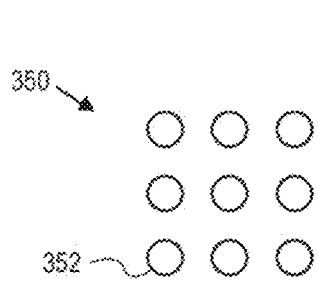
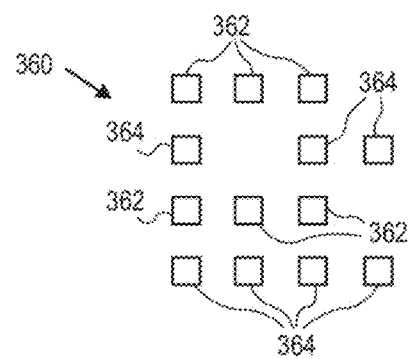
FIG. 3E  FIG. 3F Simulation Setup Forward Sigma 20nm
Line Width: 30, 200 nm
PEC: Pattern Density ISO
VSB Dose: 1.0 and 2.0

| Dose | TargetCD (nm) | ShotSize (nm) | Output CD (nm) | Dose Slope (dose/nm) | Delta CD from 5% Dose Biasing (nm) |
|---|---|---|---|---|---|
| 1.0 | 30 | 30 | 28.65 | 0.0248 | 1.9 |
| 1.0 | 200 | 200 | 200 | 0.0282 | 1.7 |
| 2.0 | 30 | 15.5 | 30 | 0.0340 | 1.4 |
| 2.0 | 200 | 180.92 | 200 | 0.0449 | 1.1 |

Simulation Results

FIG. 8
(Prior Art)

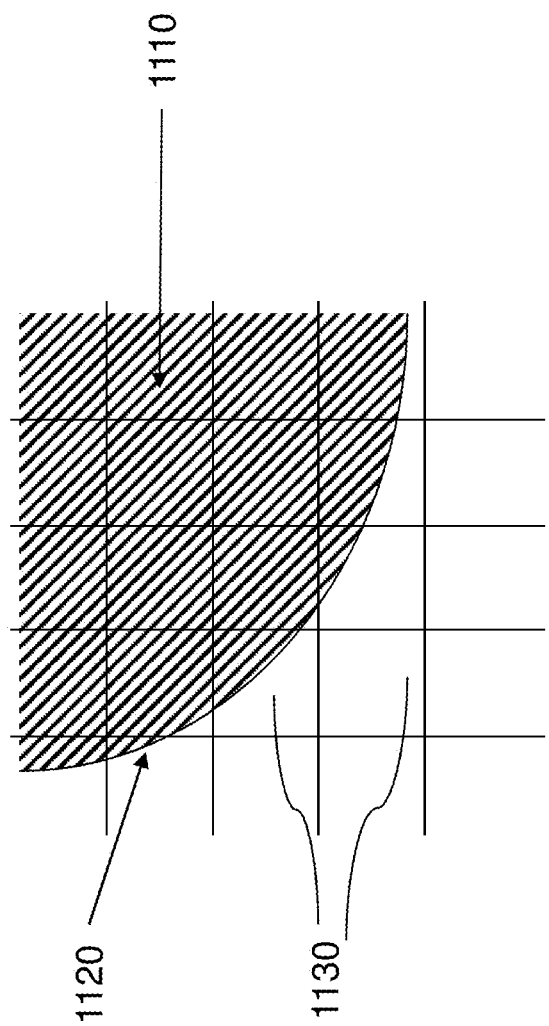

BIAS CORRECTION FOR LITHOGRAPHY

RELATED APPLICATIONS

This application claims priority to U.S. Provisional Patent Application No. 62/355,869, filed on Jun. 28, 2016 and entitled "Bias Correction in Charged Particle Beam Lithography," which is hereby incorporated by reference.

BACKGROUND OF THE DISCLOSURE

In the production or manufacturing of semiconductor devices, such as integrated circuits, optical lithography may be used to fabricate the semiconductor devices. Optical lithography is a printing process in which a lithographic mask or photomask or reticle is used to transfer patterns to a substrate such as a semiconductor or silicon wafer to create the integrated circuit (I.C.). Other substrates could include flat panel displays, holographic masks or even other reticles. While conventional optical lithography uses a light source having a wavelength of 193 nm, extreme ultraviolet (EUV) or X-ray lithography are also considered types of optical lithography in this application. The reticle or multiple reticles may contain a circuit pattern corresponding to an individual layer of the integrated circuit, and this pattern can be imaged onto a certain area on the substrate that has been coated with a layer of radiation-sensitive material known as photoresist or resist. Once the patterned layer is transferred the layer may undergo various other processes such as etching, ion-implantation (doping), metallization, oxidation, and polishing. These processes are employed to finish an individual layer in the substrate. If several layers are required, then the whole process or variations thereof will be repeated for each new layer. Eventually, a combination of multiples of devices or integrated circuits will be present on the substrate. These integrated circuits may then be separated from one another by dicing or sawing and then may be mounted into individual packages. In the more general case, the patterns on the substrate may be used to define artifacts such as display pixels, holograms, directed self-assembly (DSA) guard bands, or magnetic recording heads. Conventional optical lithography writing machines typically reduce the photomask pattern by a factor of four during the optical lithographic process. Therefore, patterns formed on the reticle or mask must be four times larger than the size of the desired pattern on the substrate or wafer.

SUMMARY OF THE DISCLOSURE

In some embodiments, a method includes inputting an array of pixels, where each pixel in the array of pixels has a pixel dose. The array of pixels represents dosage on a surface to be exposed with a plurality of patterns, each pattern of the plurality of patterns having an edge. A target bias is input. An edge of a pattern in the plurality of patterns is identified. For each pixel which is in a neighborhood of the identified edge, a calculated pixel dose is calculated such that the identified edge is relocated by the target bias. The array of pixels with the calculated pixel doses is output.

In some embodiments, a method includes inputting a plurality of patterns to be exposed on a surface, where each pattern has an edge. The method also includes inputting a target bias, and rasterizing the plurality of patterns to create an array of pixels, where each pixel in the array of pixels represents an exposure dosage. Dosages of pixels in the array of pixels are calculated, where the calculated dosages relocate the edge of a pattern in the plurality of patterns. The relocation is based on the target bias. The array of pixels is output, including the calculated pixel dosages.

In some embodiments, a system for biasing shapes to be written onto a surface includes a device configured to input an array of pixels. Each pixel comprises a pixel dose, and the array of pixels represents dosage on a surface to be exposed with a plurality of patterns. Each pattern of the plurality of patterns has an edge. The system also includes a device configured to identify an edge of a pattern in the plurality of patterns; a device configured to calculate a calculated pixel dose for pixels which are in a neighborhood of the identified edge, so that the identified edge is relocated by a target bias; and a device configured to output the array of pixels with the calculated pixel doses. The system can also include a device configured to determine the dosages in the pixel array, using a set of geometric shapes. In some embodiments, the system can also include a device configured to expose the surface with the outputted array of pixels. The device configured to calculate the pixel doses may operate simultaneously with the device configured to expose the surface, in an inline fashion. The device configured to expose the surface may comprise multiple beams.

In some embodiments, a system includes a device configured to expose a pattern onto a resist-coated surface using an electron beam, and a device configured to compute a constant distance bias. The device configured to expose may expose the resist with multiple beams. The device configured to expose and the device configured to compute may operate in an inline fashion. The device configured to compute may comprise a graphics processing unit (GPU).

BRIEF DESCRIPTION OF THE DRAWINGS

FIG. 3A illustrates an example of a rectangular shot.

FIG. 3B illustrates an example of a circular character projection shot.

FIG. 3C illustrates an example of a trapezoidal shot.

FIG. 3D illustrates an example of a dragged shot.

FIG. 3E illustrates an example of a shot which is an array of circular patterns.

FIG. 3F illustrates an example of a shot which is a sparse array of rectangular patterns.

FIG. 8 presents the results of the simulation of FIG. 7.

FIG. 11 illustrates a pattern to be rasterized, in accordance with embodiments of the present disclosure.

DETAILED DESCRIPTION OF THE EMBODIMENTS

Methods and systems are presented for biasing the dimensions of patterns to be exposed onto a surface. The methods improve the ability to produce constant distance biasing for edges of a pattern, and improve the efficiency of biasing computations compared to conventional methods. The methods use an array of pixels that represent dosages, to identify the edge of the pattern and relocate the edge to achieve a target bias. In some embodiments, dose margin can also be enhanced as part of the biasing operations. In performing the biasing, dosage calculations can be performed using dosage data only for pixels neighboring the edge. The calculations of the present methods may be performed in an inline fashion with exposing the patterns on a surface.

The present disclosure is related to lithography, and more particularly to the design and manufacture of a surface which may be the surface of a reticle, a wafer, or any other surface, using charged particle beam lithography. Although embodiments shall be described in terms of a semiconductor wafer or a photomask, the methods and systems described herein can also be applied to other components used in the manufacturing of semiconductor devices. The embodiments may also be applied to the manufacturing of various electronic devices such as flat panel displays, micro-electromechanical systems, and other microscopic structures that require precision by electron beam writing. Accordingly, a reference to shots being delivered onto a surface shall apply to, for example, a surface of a semiconductor wafer, or a surface of a reticle or photomask.

Lithography Systems

Figure 1:
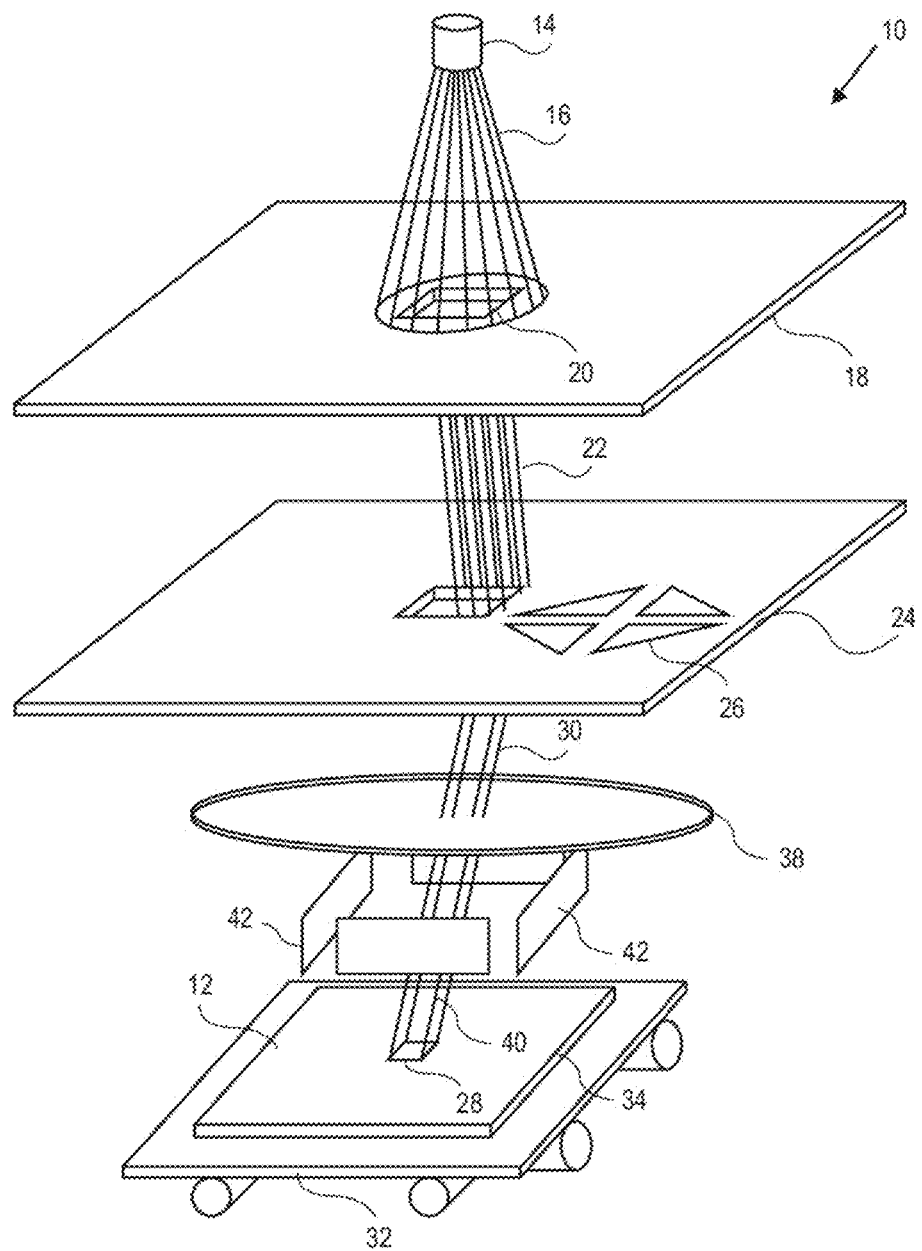
FIG. 1 illustrates an example of a variable shaped beam (VSB) charged particle beam system as known in the art.

Referring now to the drawings, wherein like numbers refer to like items, FIG. 1 illustrates an embodiment of a lithography system, such as a charged particle beam writer system, in this case an electron beam writer system 10, that employs a variable shaped beam (VSB) to manufacture a surface 12. The electron beam writer system 10 has an electron beam source 14 that projects an electron beam 16 toward an aperture plate 18. The plate 18 has an aperture 20 formed therein which allows the electron beam 16 to pass. Once the electron beam 16 passes through the aperture 20 it is directed or deflected by a system of lenses (not shown) as electron beam 22 toward another rectangular aperture plate or stencil mask 24. The stencil 24 has formed therein a number of openings or apertures 26 that define various simple shapes such as rectangles and triangles. Each aperture 26 formed in the stencil 24 may be used to form a pattern in the surface 12 of a substrate 34, such as a silicon wafer, a reticle or other substrate. An electron beam 30 emerges from one of the apertures 26 and passes through an electromagnetic or electrostatic reduction lens 38, which reduces the size of the pattern emerging from the aperture 26. In commonly available charged particle beam writer systems, the reduction factor is between 10 and 60. The reduced electron beam 40 emerges from the reduction lens 38 and is directed by a series of deflectors 42 onto the surface 12 as a pattern 28. The surface 12 is coated with resist (not shown) which reacts with the electron beam 40. The electron beam 22 may be directed to overlap a variable portion of an aperture 26, affecting the size and shape of the pattern 28. Blanking plates (not shown) are used to deflect the beam 16 or the shaped beam 22 so to prevent the electron beam from reaching the surface 12 during a period after each shot when the lenses directing the beam 22 and the deflectors 42 are being re-adjusted for the succeeding shot. Typically the blanking plates are positioned so as to deflect the electron beam 16 to prevent it from illuminating aperture 20. Conventionally, the blanking period may be a fixed length of time, or it may vary depending, for example, on how much the deflector 42 must be re-adjusted for the position of the succeeding shot.

In electron beam writer system 10, the substrate 34 is mounted on a movable platform or stage 32. The stage 32 allows substrate 34 to be repositioned so that patterns which are larger than the maximum deflection capability or field size of the charged particle beam 40 may be written to surface 12 in a series of subfields, where each subfield is within the capability of deflector 42 to deflect the beam 40. In one embodiment the substrate 34 may be a reticle. In this embodiment, the reticle, after being exposed with the pattern, undergoes various manufacturing steps through which it becomes a lithographic mask or photomask. The mask may then be used in an optical lithography machine to project an image of the reticle pattern 28, generally reduced in size, onto a silicon wafer to produce an integrated circuit. More generally, the mask is used in another device or machine to transfer the pattern 28 on to a substrate (not illustrated).

The minimum size pattern that can be projected with reasonable accuracy onto the surface 12 is limited by a variety of short-range physical effects associated with the electron beam writer system 10 and with the surface 12, which normally comprises a resist coating on the substrate 34. These effects include forward scattering, Coulomb effect, and resist diffusion. Beam blur, also called $\beta_f$, is a term used to include all of these short-range effects. The most modern electron beam writer systems can achieve an effective beam blur radius or $\beta_f$ in the range of 20 nm to 30 nm. Forward scattering may constitute one quarter to one half of the total beam blur. Modern electron beam writer systems contain numerous mechanisms to reduce each of the constituent pieces of beam blur to a minimum. Since some components of beam blur are a function of the calibration level of a particle beam writer, the $\beta_f$ of two particle beam writers of the same design may differ. The diffusion characteristics of resists may also vary. Variation of $\beta_f$ based on shot size or shot dose can be simulated and systemically accounted for. But there are other effects that cannot or are not accounted for, and they appear as random variation.

The shot dosage of a charged particle beam writer such as an electron beam writer system is a function of the intensity of the beam source 14 and the exposure time for each shot. Typically the beam intensity remains nominally fixed, and the exposure time is varied to obtain variable shot dosages. The exposure time may be varied to compensate for various long-range effects such as backscatter, fogging and loading effects in a process called proximity effect correction (PEC). Electron beam writer systems usually allow setting an overall dosage, called a base dosage, which affects all shots in an exposure pass. Some electron beam writer systems perform dosage compensation calculations within the electron beam writer system itself, and do not allow the dosage of each shot to be assigned individually as part of the input shot list, the input shots therefore having unassigned shot dosages. In such electron beam writer systems, all shots implicitly have the base dosage, before PEC. Other electron beam writer systems do allow explicit dosage assignment on a shot-by-shot basis. In electron beam writer systems that allow shot-by-shot dosage assignment, the number of available dosage levels may be 64 to 4096 or more, or there may be a relatively few available dosage levels, such as 3 to 8 levels. For scanned multi-beam systems, dosage adjustment may be done by scanning the surface multiple times.

Figure 2:
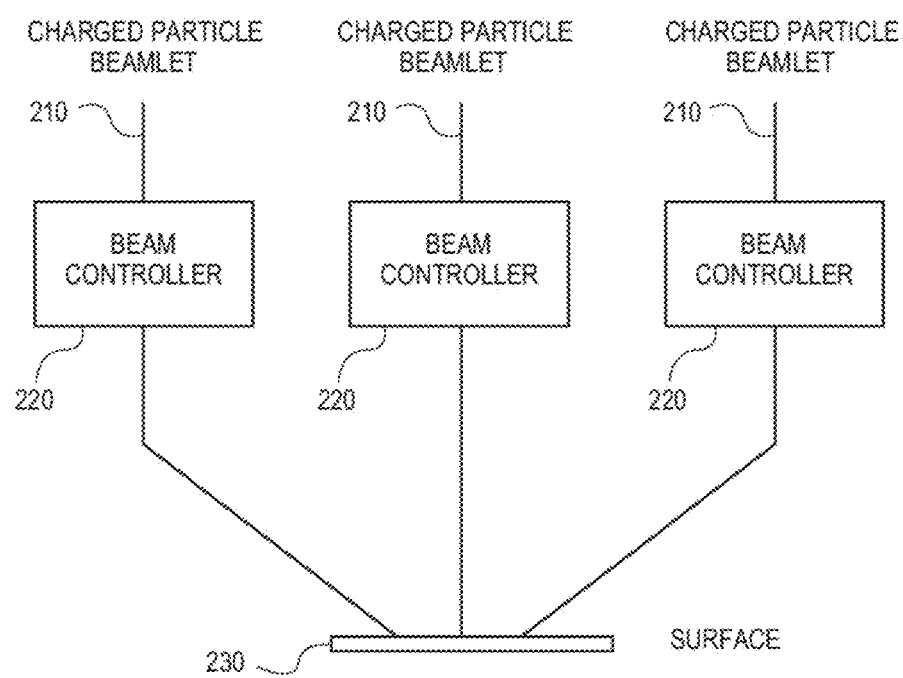
FIG. 2 illustrates an example of an electro-optical schematic diagram of a multi-beam exposure as known in the art.

A charged particle beam system may expose a surface with a plurality of individually-controllable beams or beamlets. FIG. 2 illustrates an electro-optical schematic diagram in which there are three charged particle beamlets 210. Associated with each beamlet 210 is a beam controller 220. Beam controller 220 can, for example, allow its associated beamlet 210 to strike surface 230, and can also prevent beamlet 210 from striking the surface 230. In some embodiments, beam controller 220 may also control beam blur, magnification, size and/or shape of beamlet 210. In this disclosure, a charged particle beam system which has a plurality of individually-controllable beamlets is called a multi-beam system. In some embodiments, charged particles from a single source may be sub-divided to form a plurality of beamlets 210. In other embodiments, a plurality of sources may be used to create the plurality of beamlets 210. In some embodiments, beamlets 210 may be shaped by one or more apertures, whereas in other embodiments there may be no apertures to shape the beamlets. Each beam controller 220 may allow the period of exposure of its associated beamlet to be controlled individually. Generally the beamlets will be reduced in size by one or more lenses (not shown) before striking the surface 230. In some embodiments, each beamlet may have a separate electro-optical lens, while in other embodiments a plurality of beamlets, including possibly all beamlets, will share an electro-optical lens.

For purposes of this disclosure, a shot is the exposure of some surface area over a period of time. The area may be comprised of multiple discontinuous smaller areas. A shot may be comprised of a plurality of other shots which may or may not overlap, and which may or may not be exposed simultaneously. A shot may comprise a specified dose, or the dose may be unspecified. Shots may use a shaped beam, an unshaped beam, or a combination of shaped and unshaped beams. FIGS. 3A-3F illustrate some various types of shots. FIG. 3A illustrates an example of a rectangular shot 310. A VSB charged particle beam system can, for example, form rectangular shots in a variety of x and y dimensions. FIG. 3B illustrates an example of a character projection (CP) shot 320, which is circular in this example. FIG. 3C illustrates an example of a trapezoidal shot 330. In one embodiment, shot 330 may be a created using a raster-scanned charged particle beam, where the beam is scanned, for example, in the x-direction as illustrated with scan lines 332. FIG. 3D illustrates an example of a dragged shot 340, disclosed in U.S. Patent Application Publication 2011-0089345. Shot 340 is formed by exposing the surface with a curvilinear shaped beam 342 at an initial reference position 344, and then moving the shaped beam across the surface from position 344 to position 346. A dragged shot path may be, for example, linear, piecewise linear, or curvilinear.

FIG. 3E illustrates an example of a shot 350 that is an array of circular patterns 352. Shot 350 may be formed in a variety of ways, including multiple shots of a single circular CP character, one or more shots of a CP character which is an array of circular apertures, and one or more multi-beam shots using circular apertures. FIG. 3F illustrates an example of a shot 360 that is a sparse array of rectangular patterns 362 and 364. Shot 360 may be formed in a variety of ways, including a plurality of VSB shots, a CP shot, and one or more multi-beam shots using rectangular apertures. In some embodiments of multi-beam, shot 360 may comprise a plurality of interleaved groups of other multi-beam shots. For example, patterns 362 may be shot simultaneously, then patterns 364 may be shot simultaneously at a time different from patterns 362.

Figure 4:
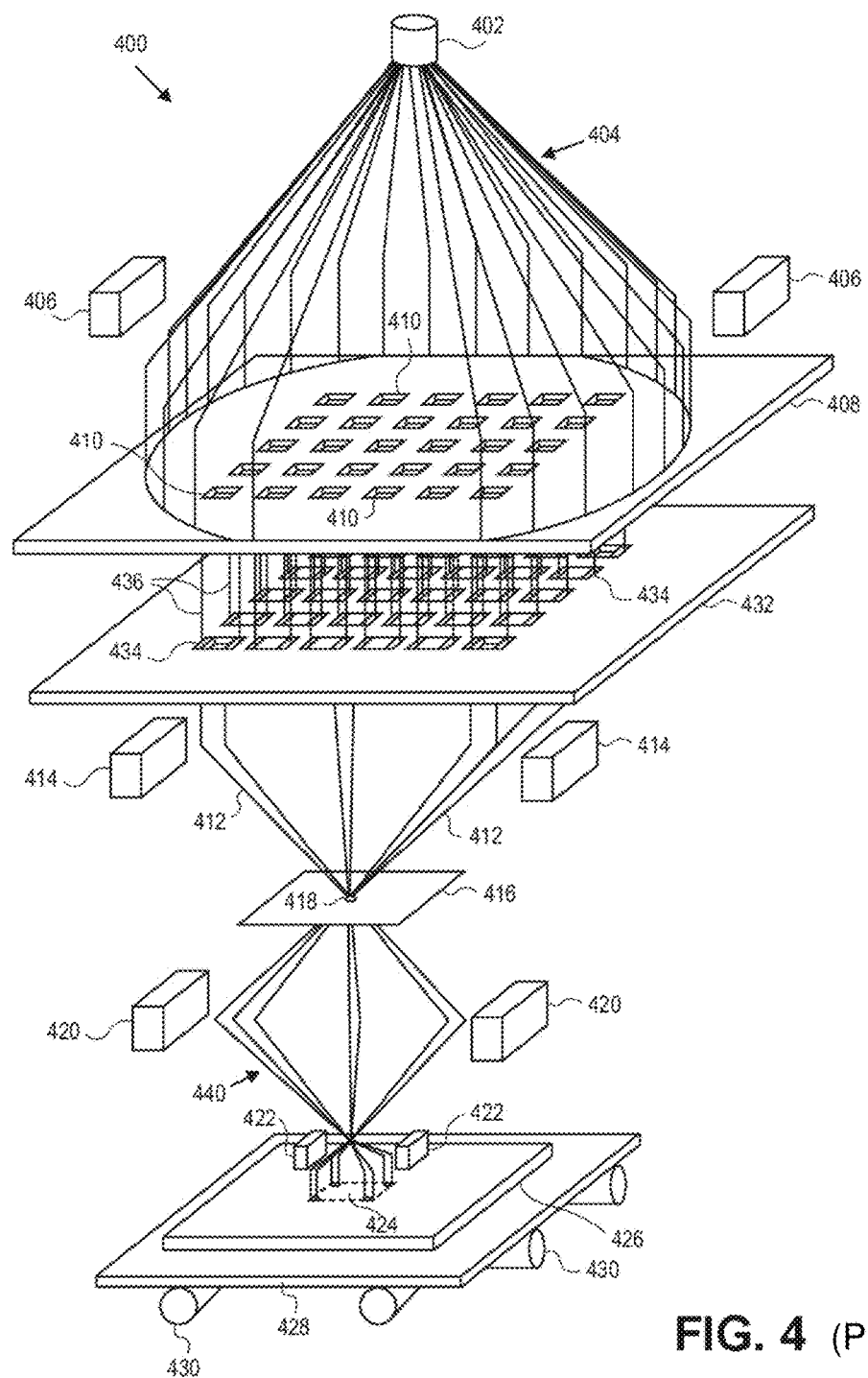
FIG. 4 illustrates an example of a multi-beam charged particle beam system as known in the art.

FIG. 4 illustrates an embodiment of a charged particle beam exposure system 400. Charged particle beam system 400 is a multi-beam system, in which a plurality of individually-controllable shaped beams can simultaneously expose a surface. Multi-beam system 400 has an electron beam source 402 that creates an electron beam 404. The electron beam 404 is directed toward aperture plate 408 by condenser 406, which may include electrostatic and/or magnetic elements. Aperture plate 408 has a plurality of apertures 410 which are illuminated by electron beam 404, and through which electron beam 404 passes to form a plurality of shaped beamlets 436. In some embodiments, aperture plate 408 may have hundreds or thousands of apertures 410. Although FIG. 4 illustrates an embodiment with a single electron beam source 402, in other embodiments apertures 410 may be illuminated by electrons from a plurality of electron beam sources. Apertures 410 may be rectangular, or may be of a different shape, for example circular. The set of beamlets 436 then illuminates a blanking controller plate 432. The blanking controller plate 432 has a plurality of blanking controllers 434, each of which is aligned with a beamlet 436. Each blanking controller 434 can individually control its associated beamlet 436, so as to either allow the beamlet 436 to strike surface 424, or to prevent the beamlet 436 from striking the surface 424. The amount of time for which the beam strikes the surface controls the total energy or "dose" applied by that beamlet. Therefore, the dose of each beamlet may be independently controlled.

In FIG. 4 beamlets that are allowed to strike surface 424 are illustrated as beamlets 412. In one embodiment, the blanking controller 434 prevents its beamlet 436 from striking the surface 424 by deflecting beamlet 436 so that it is stopped by an aperture plate 416 which contains an aperture 418. In some embodiments, blanking plate 432 may be directly adjacent to aperture plate 408. In other embodiments, the relative locations of aperture plate 408 and blanking controller 432 may be reversed from the position illustrated in FIG. 4, so that beam 404 strikes the plurality of blanking controllers 434. A system of lenses comprising elements 414, 420, and 422 allows projection of the plurality of beamlets 412 onto surface 424 of substrate 426, typically at a reduced size compared to the plurality of apertures 410. The reduced-size beamlets form a beamlet group 440 which strikes the surface 424 to form a pattern that corresponds to the pattern of the apertures 410, which are allowed to strike surface 424 by blanking controllers 434. In FIG. 4, beamlet group 440 has four beamlets illustrated for forming a pattern on surface 424.

Substrate 426 is positioned on movable platform or stage 428, which can be repositioned using actuators 430. By moving stage 428, beam 440 can expose an area larger than the dimensions of the maximum size pattern formed by beamlet group 440, using a plurality of exposures or shots. In some embodiments, the stage 428 remains stationary during an exposure, and is then repositioned for a subsequent exposure. In other embodiments, stage 428 moves continuously and at a variable velocity. In yet other embodiments, stage 428 moves continuously but at a constant velocity, which can increase the accuracy of the stage positioning. For those embodiments in which stage 428 moves continuously, a set of deflectors (not shown) may be used to move the beam to match the direction and velocity of stage 428, allowing the beamlet group 440 to remain stationary with respect to surface 424 during an exposure. In still other embodiments of multi-beam systems, individual beamlets in a beamlet group may be deflected across surface 424 independently from other beamlets in the beamlet group.

Other types of multi-beam systems may create a plurality of unshaped beamlets 436, such as by using a plurality of charged particle beam sources to create an array of Gaussian beamlets.

Conventional Bias Correction

Figure 5:
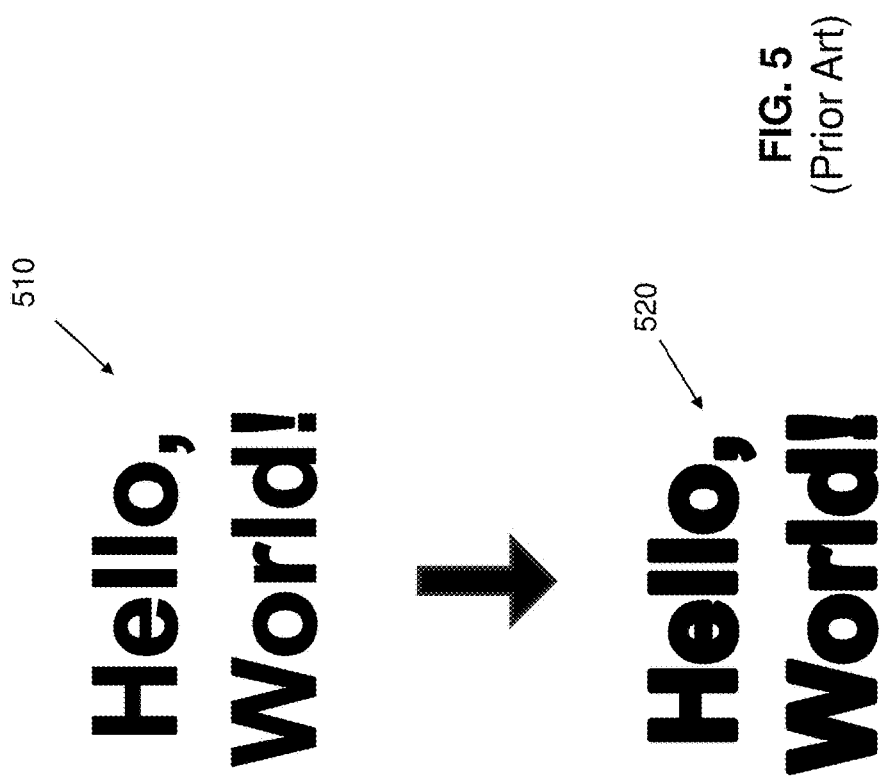
FIG. 5 illustrates an example pattern undergoing a positive bias, as known in the art.

In the process of manufacturing a pattern on a surface, it is desirable to control the widths of shapes projected onto the surface by being able to provide a given constant bias. For example, often, one "mask" is made, then it might be determined that for whatever reason the pattern features on it are slightly too thick or too thin, say by 2.3 nm. The fabricator would then desire to bias all the edges in the pattern by 2.3 nm/2=1.65 nm in another iteration to create the next better version. Constant bias is illustrated in FIG. 5. FIG. 5 shows an example pattern 510 comprising the text "Hello World". Pattern 520 is similar to the original pattern 510, but where the edges which have been positively biased in pattern 520—i.e. the edges have been moved outward—so that the letters are thicker. In biasing, the edges of each figure in a pattern are biased "inwards" or "outwards," to make the width of each pattern narrower or fatter. The scale of the pattern does not change. Biasing may be performed, for example, to account for changes in etching characteristics (over-etching or under-etching).

Figure 6:
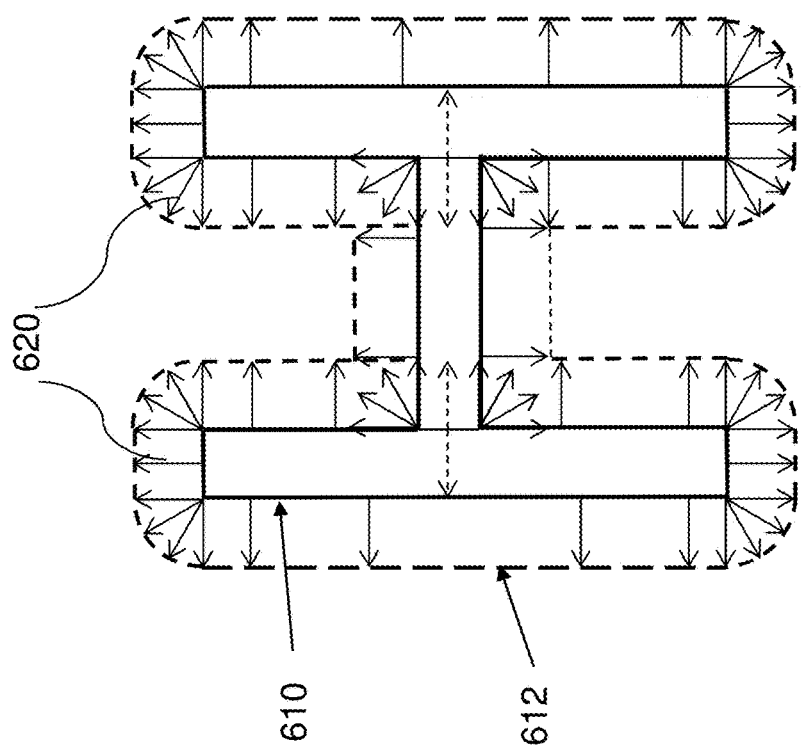
FIG. 6 illustrates geometric biasing as known in the art.

FIG. 6 illustrates a conventional method of producing bias, by biasing the input CAD (computer-aided design) shapes geometrically. Element 610 is an original pattern, in the shape of an "H". Vectors 620 illustrate the direction in which each edge portion of pattern 610 is to move during positive biasing. Element 612 illustrates the revised pattern after a positive bias. Performing the biasing on shapes is a complex operation:

Positive biasing—outward biasing—can create overlaps, which must be eliminated in a post-processing step.
Negative biasing—inward biasing—can cause narrow areas to disappear.
Positive biasing, done correctly, causes square corners to become rounded. Curvilinear shapes are difficult to represent and process in most CAD systems.
The resulting output file is usually larger than the input file, and requires significant time to write and to subsequently read from, for example, a computer disk.

This geometric method is not popular, because of the substantial computational effort required to bias the CAD shapes, and the consequent effect on mask turnaround time.

In a variant of the above method, the CAD shapes may be biased as they are read into a mask exposure system. Doing this saves disk input/output (I/O) volume, reducing or eliminating the turnaround time issue. However, this method still has the problem that a geometric constant bias is often not the only correction that is desired.

Another known correction method is to bias the dose of the source. If all shapes have a similar dose margin (i.e., edge slope), a desired constant distance bias can be obtained by changing the dose delivered to the surface. This has been the predominant method of biasing. The current method works well when dose margin is a good proxy for all sources of manufacturing variation. There are situations where constant bias in width is desirable. The current method does not work to create bias that is uniform in bias width, except when the following conditions are satisfied:

Minimum shape dimensions are fairly large when compared to the forward blur of the writing process, such as >100 nm (mask coordinates) for the leading edge mask processes in semiconductor device manufacturing.
All shots were "normal" dosage—also called 1.0—before correction for long-range effects.
Shots do not overlap, since shot overlap creates areas of differing dosage.
The amount of backscatter provided by adjacent shots, typically within about a 10-30 um range for a leading edge photomask for semiconductor devices, is relatively constant across the entire surface.

Short-range effects cause some non-uniformity in biasing, but with fairly large shots this has been acceptable.

In the most advanced masks, however, some or all of these conditions may be violated:

Minimum shape dimensions are small, such as less than 100 nm in mask coordinates for electron beam lithography.
Shots have varying dosages.
Shot may overlap.
10-30 um scale local density may vary significantly across the surface.

In this environment, a dosage change does not produce constant distance biasing.

Figure 7:
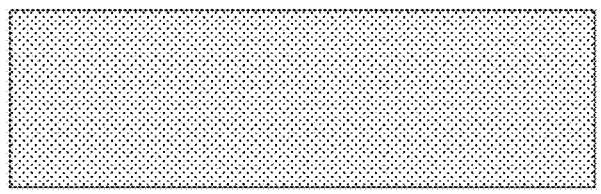
FIG. 7 describes simulation setup conditions for a simulation of dose biasing as known in the art.

FIGS. 7, 8, 9 and 10 show the results of simulating a 5% dosage bias according to conventional methods, with shapes of differing sizes, and starting with different exposure dosages, with electron beam exposure. FIG. 7 presents the conditions of the simulation, which was done using two long shots: one shot with a width of 30 nm and one shot with a width of 200 nm. The following simulation conditions were used:

Forward sigma of 20 nm. This simulates forward scattering and other effects which are collectively referred to as "beam blur."
PEC: Pattern density ISO, meaning that the lines is isolated, for the purposes of proximity effect correction (PEC). As in known to those skilled in the art, PEC corrects for backward scattering and other long range effects.
Two dosages for VSB shots: 1.0 and 2.0.

There are therefore four simulations: two shape widths at each of two dosages. FIG. 8 presents the results of the simulation.

"Dose" column: The shot dosage, assuming a 0.5 threshold.
"TargetCD": The two desired pattern widths of 30 nm and 200 nm.
"ShotSize": The actual shot size. As can be seen, for 1.0 dose, the shot size is the same as the TargetCD. For 2.0 dose, the shots must be made narrower to achieve the TargetCD.
"Output CD": The simulated CD achieved with the specified shot width and shot dose. Note that the 30 nm wide shot does not produce a 30 nm wide pattern at a 1.0 dose, due to the small shot size.

"Dose Margin/Edge Slope": The calculated dose margin at the pattern edge.

"Delta CD from 5% Dose Biasing": This is the change in pattern width that would be produced by changing the dosage 5%.

As can be seen from FIG. 8, the change in dimension (Delta CD) from the 5% dose biasing varies between the 30 nm and 200 nm wide shapes, and also between the 1.0 and 2.0 dosages. This illustrates that dose biasing does not provide a constant distance dimensional change across the conditions of the simulation.

Figure 9:
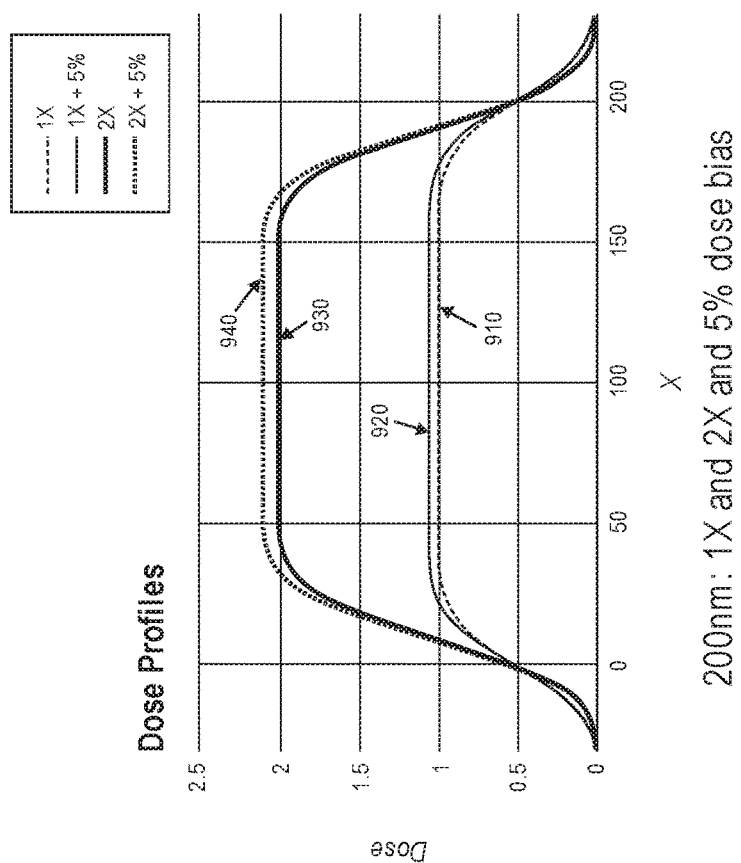
FIG. 9 illustrates dosage profiles for the simulation of dose biasing of FIG. 7.
Figure 10:
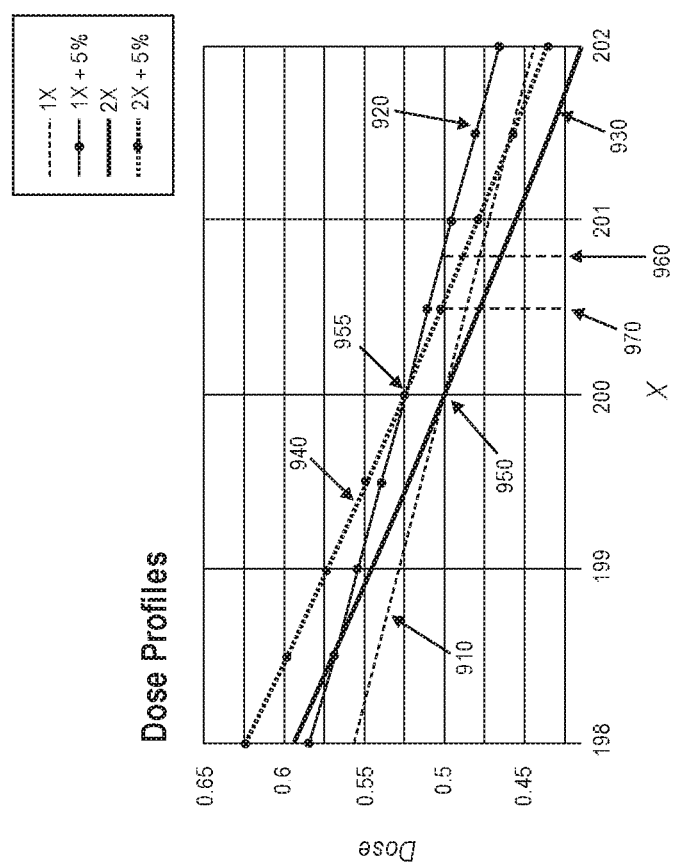
FIG. 10 is a close-up view of a portion of the graph of FIG. 9.

FIG. 9 illustrates dosage profiles for the 200 nm shape, for 1.0 dose, 1.05 dose, 2.0 dose, and 2.1 dose (2.0*105%). Curve 910 is the dosage profile for 1.0 dose; curve 920 is the dosage profile for 1.05 dose (1.0*105%); curve 930 is the dosage profile for 2.0 dose; and curve 940 is the dosage profile for 2.1 dose (2.0*105%). FIG. 10 illustrates the same dosage profiles as FIG. 9, but zoomed in near the 200 nm/0.5 (threshold) dosage point. Point 950 indicates that the 1.0 and 2.0 doses (curves 910 and 930, respectively) cross the 0.5 threshold value at an x-coordinate of 200 nm. Point 955 indicates that both the 1× and 2× doses with 5% bias (curves 920 and 940, respectively) have doses of 1.05*0.5=0.525 at the pre-bias contour (x=200 nm). Thus, for both the 1.05 dosage curve 920 and for the 2.1 dosage curve 940, the dose at an x-coordinate of 200 nm is 5% above the 0.5 threshold value at an x-coordinate of 200 nm. The 5% dose increase at an x-coordinate of 200 nm has therefore been achieved. The amount the edge will move with a 5% dose is determined by where the curve crosses the threshold value of 0.5. Curve 920 intersects dose=0.5 at x-coordinate 960. Curve 940, which has a higher slope than curve 920, intersects dose=0.5 at x-coordinate 970, which is closer to x-coordinate 200 nm than is x-coordinate 960. Constant biasing is therefore not achieved.

Thus, improved methods of bias correction are needed.

Improved Bias Correction

The present disclosure shall apply to manufacturing patterns using a multi-beam energy source, on any surface such as a mask, wafer, flat panel display (FPD), or FPD mask. The types of energy sources include electron beam (eBeam), proton beam, argon fluoride (ArF) optical laser, multi-frequency lasers (as FPD writers use), and EUV. In multi-beam, a single chamber (often called the column) houses an apparatus that shoots multiple shapes simultaneously either through a single source (e.g., electron gun or light source) or through multiple sources. Multiple shapes may be an array of, for example, 512×512, but can be any number such as ranging from a total of approximately 10 or less, to much more than 512×512. These shapes, which may be squares, are referred to as pixels in this disclosure.

Embodiments utilize a multi-beam machine to modify the dose of individual pixels to bring about a constant distance bias for every edge of every shape for the whole mask. This can be done inline within the machine, for example by using graphics processing unit (GPU) acceleration for the computing. By computing the simulated effect of a dose change of the pixels, every edge can be biased by approximately plus or minus a portion of the pixel size, while also manipulating the dose profile to enhance dose margin in various ways. The implementation may involve, for example, less than a pixel of bias, such as half a pixel. Larger biases with more complex analyses are also possible. "Enhancing" or improving dose margin is thought of as increasing dose slope (making it steeper) so that it is less susceptible to manufacturing variation. Since calculations for many pixels can be done in parallel, special purpose hardware devices may be used to improve performance over general purpose CPUs. In some embodiments, the special purpose hardware device may be a graphical processing unit (GPU).

Improving the uniformity of dose margins across the mask is an important agenda for mask shops. This has been because mask shops in some situations want to modify dose to achieve a relatively constant edge bias for all shapes in the mask. The present methods offer a superior alternative to that methodology in providing a way to achieve edge bias correction without any turnaround time penalty of another iteration of CAD.

In FIG. 11, shaded quarter circle 1110 represents a section of a pattern to be written onto a surface. Each pattern has at least one edge, such that a plurality of patterns for a surface has a plurality of edges. The quarter circle 1110 portion of the pattern comprises edge 1120. As can be seen in the example of FIG. 11, a pattern may cover fractional portions of pixels 1130 in the array of pixels. Each pixel 1130 has a corresponding dose. In this example, the dose for pixels fully covered by the pattern is 1.0; doses for pixels at or near an edge of the pattern have a non-zero fractional amount (e.g., 0.05 to 0.9); and pixels that are outside of the pattern or pattern edge have a dose of zero. The pixel coverage can be used to generate the location of the desired edge within each pixel, as well as the local dose slope gradient.

Figure 12B:
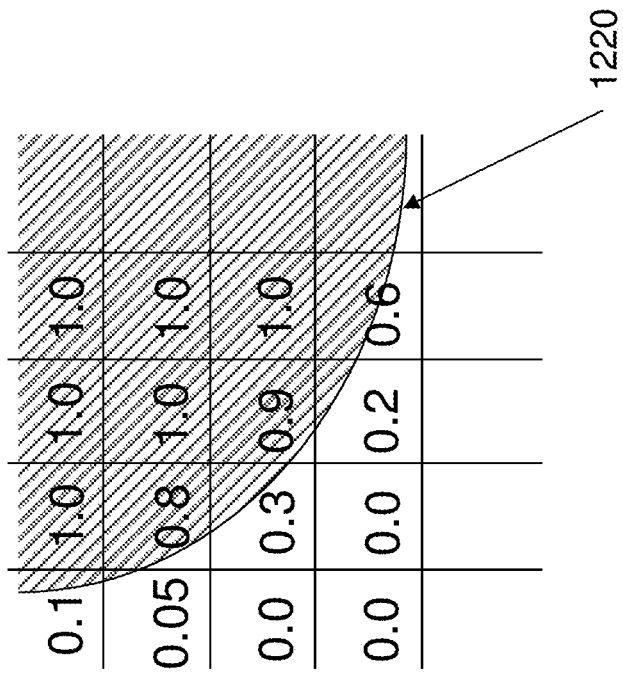
FIG. 12B illustrates a pixel dosage array of FIG. 12A with a calculated edge.
Figure 12A:
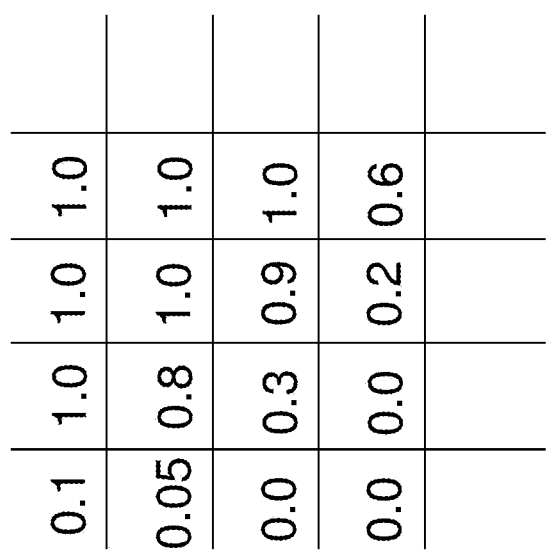
FIG. 12A illustrates rasterization of the pattern of FIG. 11 into a two-dimensional pixel dosage array in accordance with embodiments of the present disclosure.

FIG. 12A illustrates rasterization of a portion of a surface into a grid, or array, of pixels. Pixels are typically 10 nm, although they may be 7 nm, 20 nm, or any other size. The values illustrated in each pixel of the FIG. 12A grid represent dosage values to be exposed onto the surface from FIG. 11 pattern 1110. In this example, the dose threshold is 0.5.

Using the pixel array of FIG. 12A, a shape edge can be calculated. In some embodiments, interpolation can be used to determine the x and y coordinates where dosage crosses the dose threshold. For each specified pixel in which an edge of a pattern has been identified, a location and an orientation of the identified edge is determined. FIG. 12B illustrates the pixel array of FIG. 12A, with identified edge 1220 also illustrated. Desirably, calculation of identified edge 1220 can be done using dosages only from pixels in the neighborhood of the edge, which facilitates parallel processing in doing the calculations. The neighborhood of the edge may be, for example, within 1-5 pixels away from the edge.

Figures 13A, 13B:
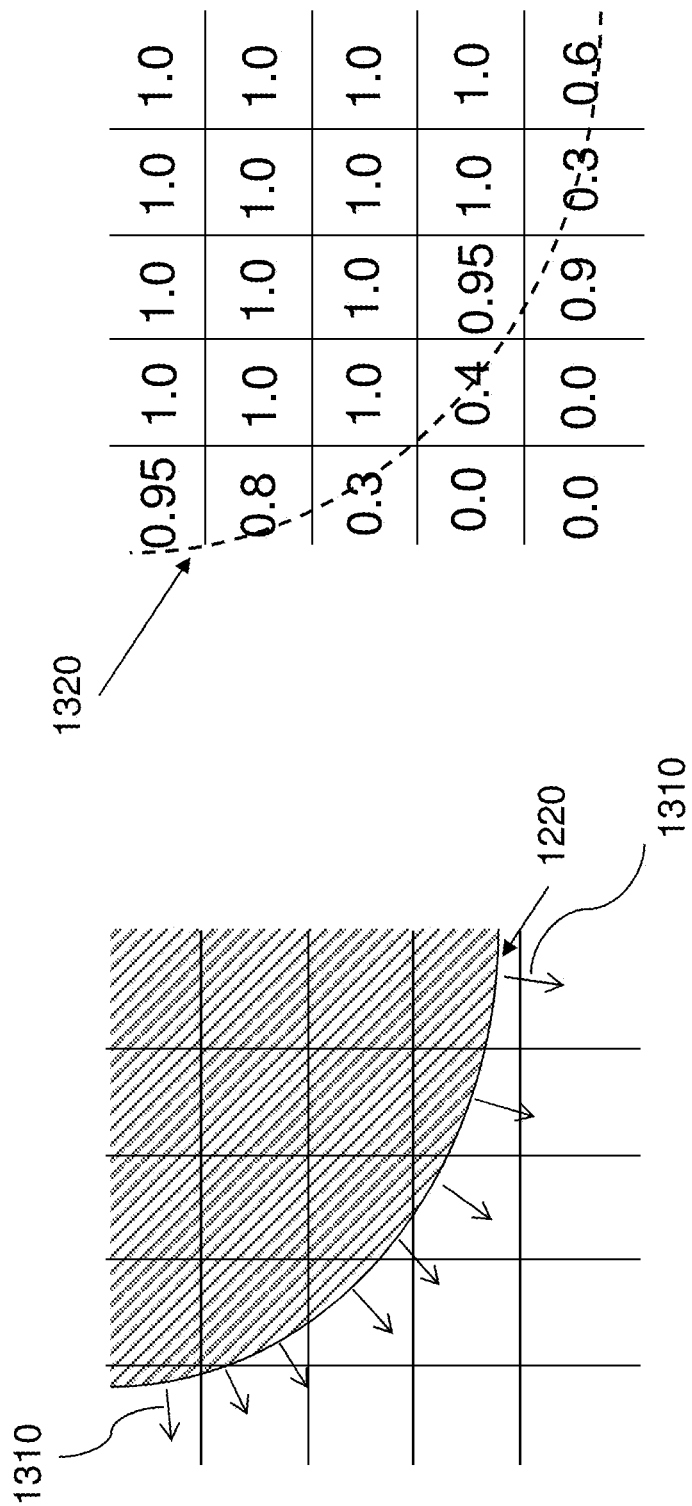
FIG. 13A illustrates the pixel dosage array of FIG. 12A with gradients from the calculated edge.
FIG. 13B illustrates dosages of the pixel array of FIG. 12A, after relocation of the edge by a target bias amount.

Knowing the shape edge 1220, the mathematical gradient of this edge may be calculated at any point on the edge. FIG. 13A graphically illustrates the gradient vectors 1310 extending from edge 1220, in the direction of a positive bias. For negative bias, each gradient vector would point in an opposite direction.

FIG. 13B illustrates the pixel array, where pixel dosages have been calculated to relocate edge 1220 by the target bias amount, to position 1320.

The calculations described above are repeated for each pixel near any of the plurality of edges in the plurality of patterns. As indicated in the above example, calculations required for edge biasing using pixel dosage arrays can be done for each pixel using dosage information for only nearby pixels. This allows parallel processing of calculations. In some embodiments, the parallel processing may comprise use of graphical processing units (GPUs) or other specialized hardware.

Figure 14:
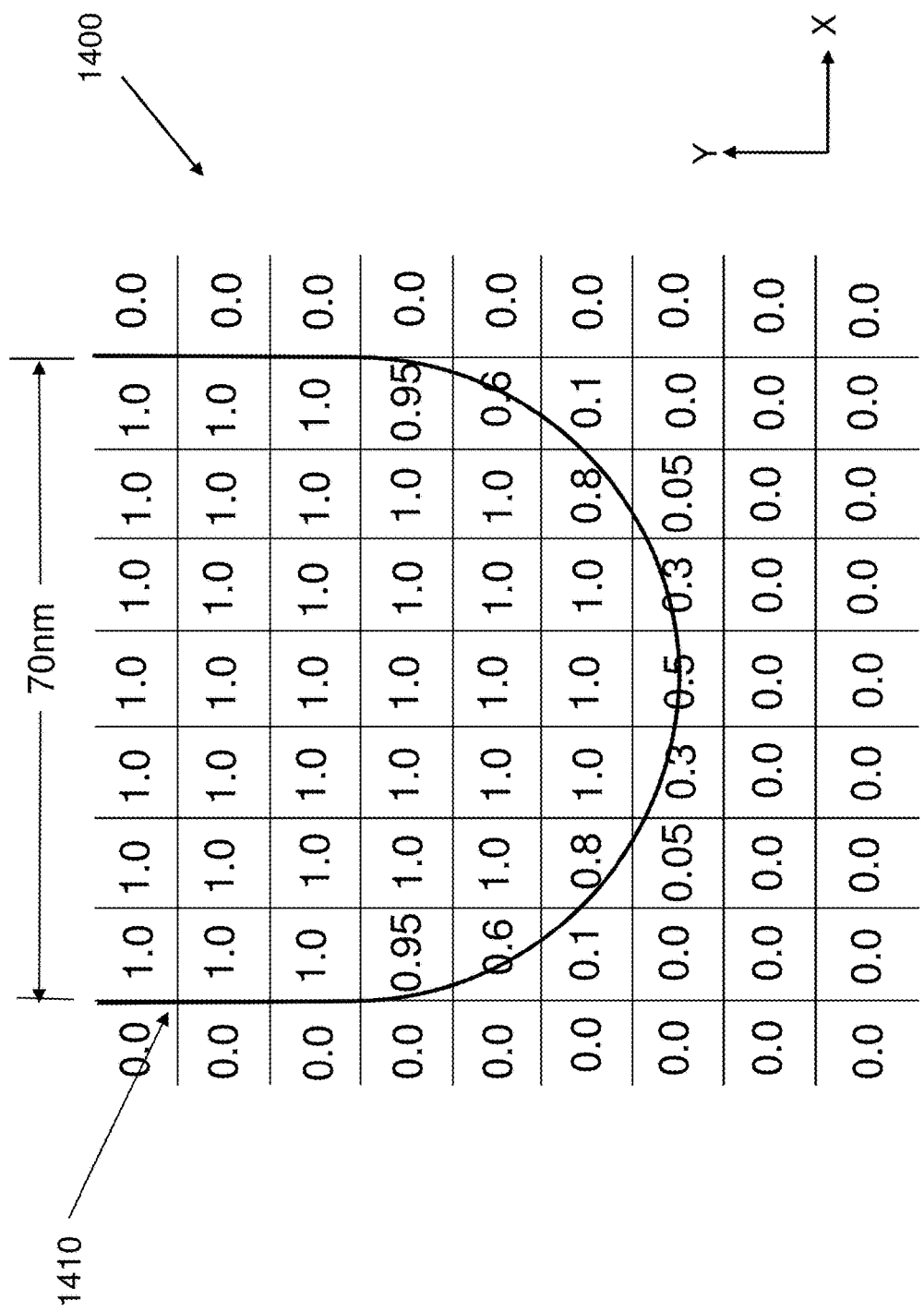
FIG. 14 illustrates a pixel dosage array and a calculated line-end pattern, in accordance with some embodiments.
Figure 15:
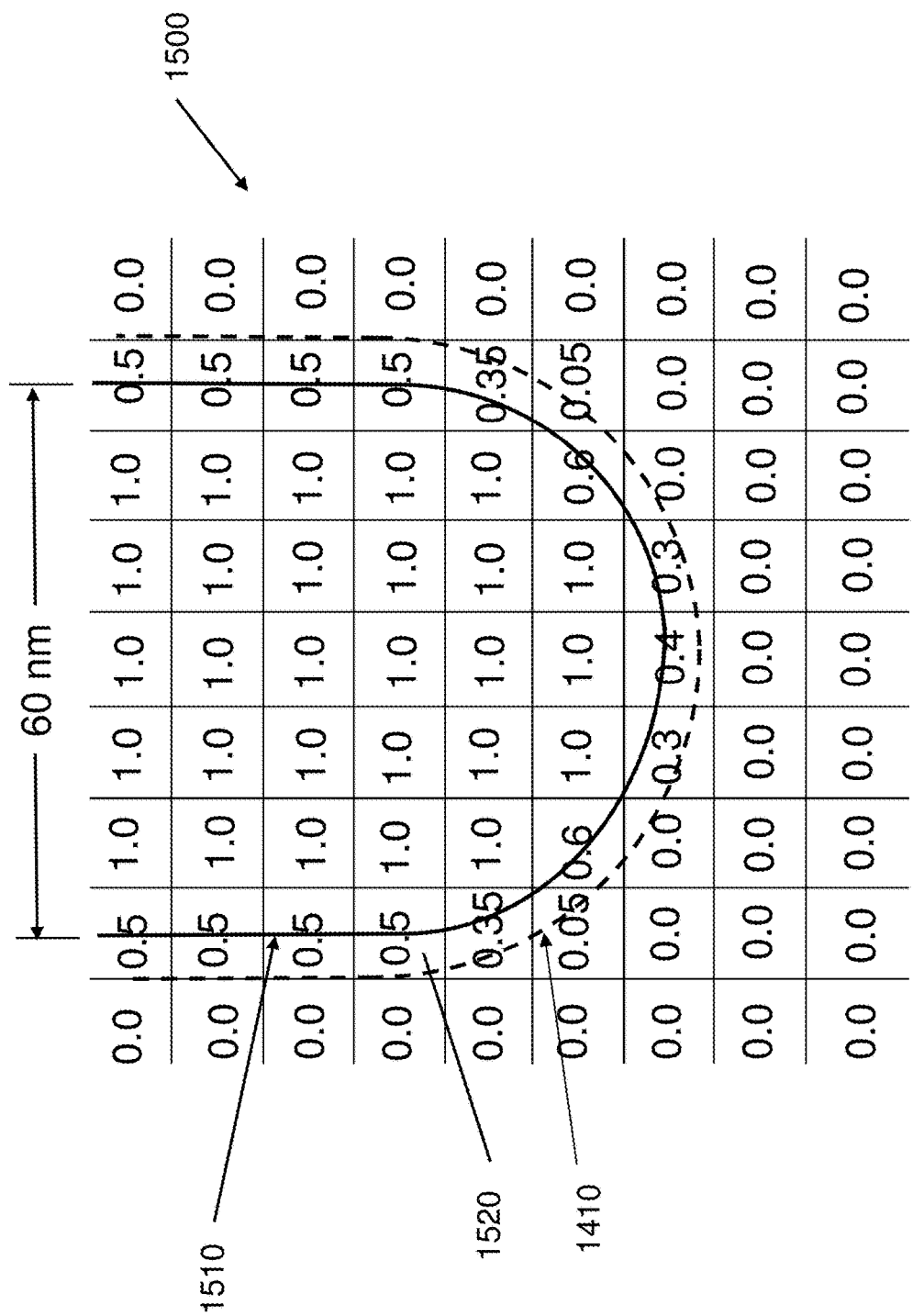
FIG. 15 illustrates the pixel dosage array of FIG. 14 after biasing the line-end pattern.
Figure 16:
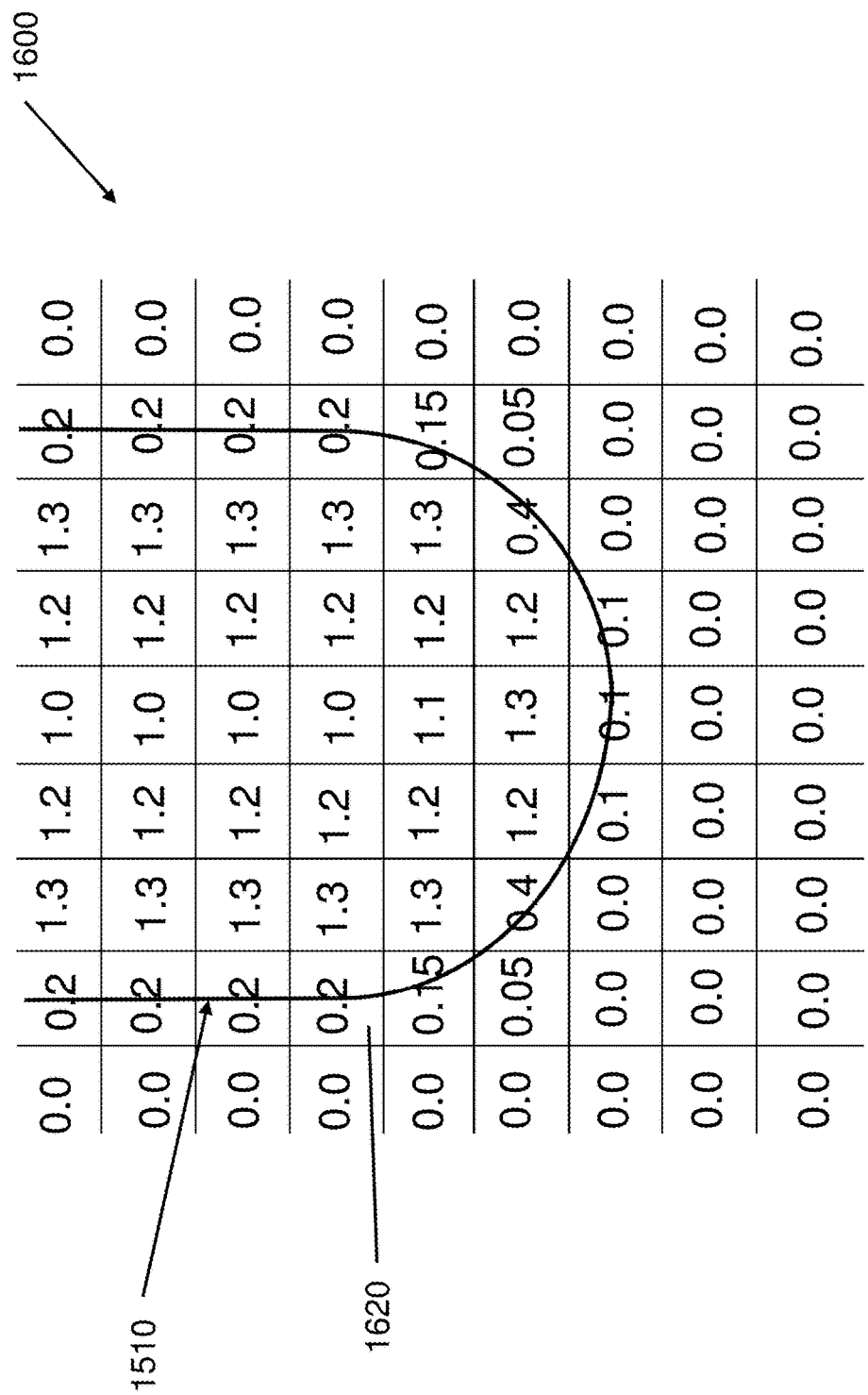
FIG. 16 illustrates the pixel dosage array of FIG. 15 after dosage enhancement to improve dose margin.

Dose margin enhancement can also be accomplished with pixel dosage array shape data. As is known to those skilled in the art, in a leading edge mask process in semiconductor device manufacturing, for example, when shapes smaller than approximately 100 nm in mask dimensions are exposed with a normal 1.0 dose shot, the edge will have a lower dose margin than for larger shots. FIGS. 14-16 illustrate how biasing can be combined with dose margin enhancement. FIG. 14 illustrates an example pixel dose array 1400 to be exposed using an electron beam exposure system. In this example, the pixel size is 10 nm in both X and Y directions. A calculated edge 1410 is determined from this data, representing a line end pattern. As shown in FIG. 14, the width of the line end pattern in this example is 70 nm.

FIG. 15 a pixel array in which pixel dosages have been calculated to negatively bias edge 1410, relocating it to position 1510. The biased pattern with edge position 1510 has a width of 60 nm, using a target bias of 10 nm from the original 70 nm width. The maximum pixel dosage is 1.0. Pixel 1520, for example, through which the target edge traverses, has a dosage of 0.5. As is known to those skilled in the art, a 60 nm wide line end pattern exposed with a normal 1.0 dose will have an undesirably low dose margin because of the characteristics of electron beam exposure systems when exposing patterns which are this small.

Dose margin can be improved by increasing the dose of pixels near edge 1510, as illustrated in FIG. 16. In pixel array 1600 of FIG. 16, the maximum pixel dosage is set to 1.3, meaning 1.3 time a normal dose. Pixel array 1600 has a higher dose margin for the biased edge 1510 than does pixel array 1500. In pixel array 1600, pixels in the center of the line end pattern remain at 1.0 dose, since increasing the dose of these pixels is less effective at improving dose margin than providing increased dosage closer to the edge 1510. Pixel 1620, which corresponds to FIG. 15 pixel 1520, has a dose of 0.2—less than pixel 1520, which is necessary to maintain the target edge with the adjacent interior pixel having a dose of 1.3.

In the example of FIG. 16, the maximum pixel dosage is 1.3. Use of even higher pixel dosages can further improve dose margin. However, in some multi-beam exposure systems, the exposure time for the surface is determined by the maximum dosage pixel(s) in the pattern. Higher maximum pixel dosages lengthen the overall exposure time, increasing turnaround time and cost.

Figure 17:
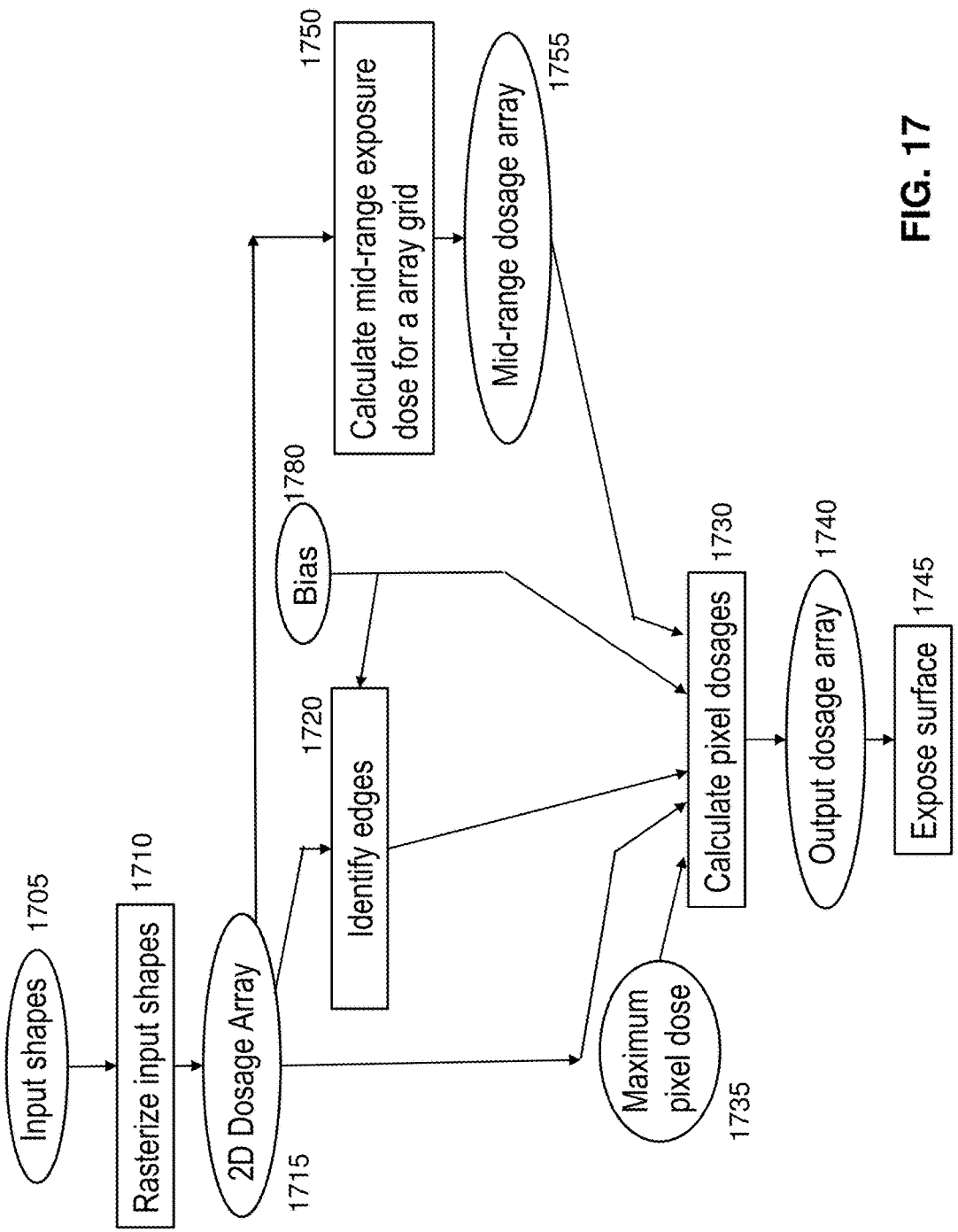
FIG. 17 is a conceptual flow diagram of a method for pattern biasing using a pixel dosage array, in accordance with some embodiments.

FIG. 17 illustrates an example flowchart for performing bias corrections, in accordance with some embodiments. The input is a set of shapes 1705, such as from a computer-aided design (CAD) system. The set of shapes 1705 may be a plurality of patterns, for example, a set of geometric shapes. Each pattern in the plurality of patterns has an edge. In step 1710, the input shapes are rasterized by determining the pixel doses in a 2-dimensional array of pixels, using the plurality of patterns, to create a 2-dimensional array of dosages 1715 which represent dosages for a pixelized representation of a surface to be exposed. Each pixel in the array of pixels represents an exposure dosage. The pattern data of the plurality of patterns—e.g., the geometric shape data of the patterns—is rasterized to create the array of pixels. Using the array 1715, in step 1720 the edges of the patterns are identified, and the gradient vectors along each of the edges are calculated. Identification of the edges in step 1720 may include calculating a location of the edge using pixel dosages of the array of pixels. Step 1720 also uses as input the target bias 1780. The direction of the gradient vectors is determined by whether the desired bias is positive (outward) or negative (inward).

In step 1730 pixel dosages are calculated which will cause edges to be relocated by the target bias 1780. Step 1730 uses as input the array 1715 and the target bias 1780. Additionally, step 1730 may input a predetermined maximum pixel dose 1735. In some embodiments, step 1730 includes calculating the dose margin of each relocated edge, and adjusting pixel dosages to increase the dose margin in locations where the dose margin is less than a pre-determined minimum acceptable value. For example, the dose margin may be improved by increasing the pixel dose of a pixel near the relocated edge. The dose margin may be maximized, within a constraint of a predetermined maximum pixel dose, or it may be improved to at least a predetermined minimum dose margin. In other embodiments, step 1730 includes maximizing the dose margin of each edge, subject to the maximum pixel dose. In some embodiments, step 1730 may also include correction for non-linearities in the exposure system hardware. Step 1730 outputs dosage array 1740, which is the array of pixels with the calculated pixel dosages. In step 1745, a surface is exposed in a multi-beam exposure system using the dosage array 1740.

In some embodiments, calculating the calculated pixel dose in step 1730 can include compensating for a mid-range scattering. In one embodiment, mid-range exposure effects are calculated in step 1750 from dosage array 1715. Step 1750 outputs a mid-range dosage array 1755. The mid-range dosage array 1755 may be coarser than array 1715—i.e. each pixel in array 1755 represents a larger area than in dosage array 1715. In step 1730, dosage from a pixel in mid-range dose array 1755 is subtracted from each calculated pixel dosage before outputting the dosage to array 1740.

Other quantities at the edges of the patterns can be adjusted using the same pixel methodology, such as compensating for eBeam non-linearity.

As described above, in the present methods all the calculations for the bias are local. Ordinarily, to do this sort of biasing geometrically, one would first need to analyze and combine the various geometric primitives together, which is an expensive operation. In contrast, by performing the biasing after the geometric data has been rasterized into pixels as in the present methods, it is possible to perform the biasing as a set of small local calculations, modifying each pixel based on nothing more than its immediate neighbors. Such local calculations enable the processing to be parallelized. In some embodiments, calculations may be performed in real time as an inline process, during the exposure of the surface by a multi-beam exposure system. In other embodiments, calculations may be performed during the exposure of another surface, in a pipelined fashion. In a pipelined system, the next surface to be written on the machine is calculated while the previous surface is being written on the machine. A pipelined system is effective for improving the throughput of many surfaces, if the surfaces have similar write times and compute times. An inline (real time) system is effective for improving the throughput as well as the turnaround times of each surface.

The present methods can be used offline, pipelined, or inline. Being fast enough to be able to process inline is most desirable. Inline processing is most desirable particularly when the number of total pixels that needs to be written is very large. For example, for semiconductor device manufacturing for multi-beam eBeam writing of masks, over 500 T-Bytes of data are required to store all the pixel data. Since multi-beam eBeam machines need to write the pixels extremely quickly, storing such data on hard disk or even solid state disk may not be practical in cost. In inline processing, unlike in offline or pipelined processing, there is no need to store the data because the machine consumes the data to write the pixels soon after the data is computed. This is another reason why inline processing that the present methods enable is valuable. As mentioned above, the same methodology can be used for adjusting pixel doses to improve dose margin (i.e., edge slope).

The calculations described or referred to in this disclosure may be accomplished in various ways. Due to the large amount of calculations required, multiple computers or processor cores of a CPU may also be used in parallel. In one embodiment, the computations may be subdivided into a plurality of 2-dimensional geometric regions for one or more computation-intensive steps in the flow, to support parallel processing. In another embodiment, a special-purpose hardware device, either used singly or in multiples, may be used to perform the computations of one or more steps with greater speed than using general-purpose computers or processor cores. Specialty computing hardware devices or processors may include, for example, field-programmable gate arrays (FPGA), application-specific integrated circuits (ASIC), or digital signal processor (DSP) chips. In one embodiment, the special-purpose hardware device may be a graphics processing unit (GPU). In another embodiment, the optimization and simulation processes described in this disclosure may include iterative processes of revising and recalculating possible solutions. In yet another embodiment, calculations may be performed in a correct-by-construction method, so that no iterations are required.

Figure 18:
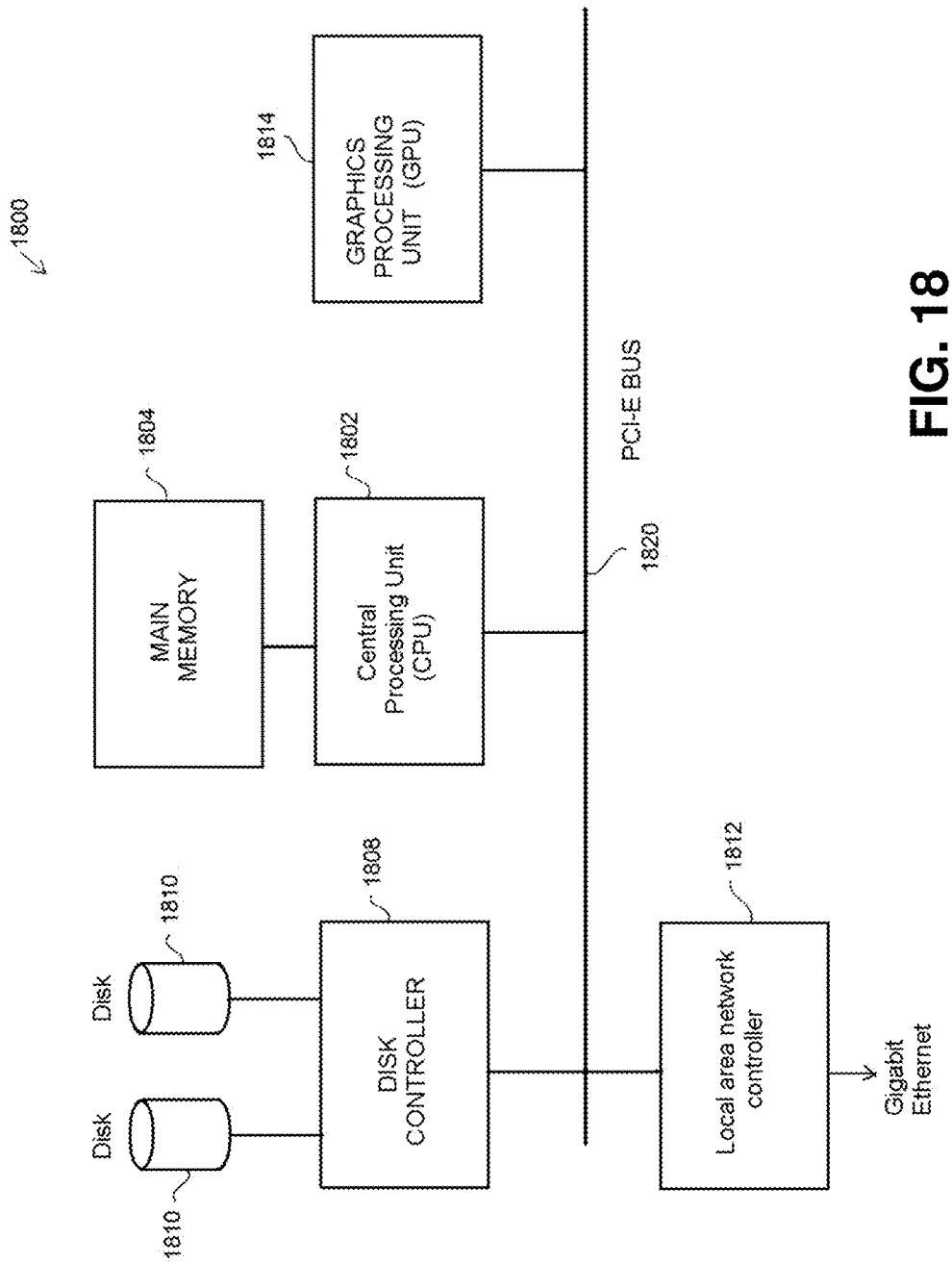
FIG. 18 illustrates a computing hardware device used in accordance with embodiments of the present methods.

FIG. 18 illustrates an example of a computing hardware device 1800 that may be used to perform the calculations described in this disclosure. Computing hardware device 1800 comprises a central processing unit (CPU) 1802, with attached main memory 1804. The CPU may comprise, for example, eight processing cores, thereby enhancing performance of any parts of the computer software that are multi-threaded. The size of main memory 1804 may be, for example, 64 G-bytes. The CPU 1802 is connected to a Peripheral Component Interconnect Express (PCIe) bus 1820. A graphics processing unit (GPU) 1814 is also connected to the PCIe bus. In computing hardware device 1800, the GPU 1814 may or may not be connected to a graphics output device such as a video monitor. If not connected to a graphics output device, GPU 1814 may be used purely as a high-speed parallel computation engine. The computing software may obtain significantly-higher performance by using the GPU for a portion of the calculations, compared to using CPU 1802 for all the calculations. The CPU 1802 communicates with the GPU 1814 via PCIe bus 1820. In other embodiments (not illustrated) GPU 1814 may be integrated with CPU 1802, rather than being connected to PCIe bus 1820. Disk controller 1808 may also be attached to the PCIe bus, with, for example, two disks 1810 connected to disk controller 1808. Finally, a local area network (LAN) controller 1812 may also be attached to the PCIe bus, and provides Gigabit Ethernet (GbE) connectivity to other computers. In some embodiments, the computer software and/or the design data are stored on disks 1810. In other embodiments, either the computer programs or the design data or both the computer programs and the design data may be accessed from other computers or file serving hardware via the GbE Ethernet.

In some embodiments, a system for biasing shapes to be written onto a surface includes a device configured to input an array of pixels. Each pixel comprises a pixel dose, and the array of pixels represents dosage on a surface to be exposed with a plurality of patterns. Each pattern of the plurality of patterns has an edge. The system also includes a device configured to identify an edge of a pattern in the plurality of patterns; a device configured to calculate a calculated pixel dose for pixels which are in a neighborhood of the identified edge, so that the identified edge is relocated by a target bias; and a device configured to output the array of pixels with the calculated pixel doses. In some embodiments, the system includes a device configured to determine the dosages in the pixel array, using a set of geometric shapes. In some embodiments, the system can also include a device configured to expose the surface with the outputted array of pixels. The device configured to calculate the pixel doses may operate simultaneously with the device configured to expose the surface, in an inline fashion. The device configured to expose the surface may comprise multiple beams.

In some embodiments, a system includes a device configured to expose a pattern onto a resist-coated surface using an electron beam, and a device configured to compute a constant distance bias. The device configured to expose may expose the resist of the resist-coated surface with multiple beams. The device configured to expose and the device configured to compute may operate in an inline fashion. The device configured to compute may comprise a graphics processing unit (GPU).

Reference has been made in detail to embodiments of the disclosed invention, one or more examples of which have been illustrated in the accompanying figures. Each example has been provided by way of explanation of the present technology, not as a limitation of the present technology. In fact, while the specification has been described in detail with respect to specific embodiments of the invention, it will be appreciated that those skilled in the art, upon attaining an understanding of the foregoing, may readily conceive of alterations to, variations of, and equivalents to these embodiments. For instance, features illustrated or described as part of one embodiment may be used with another embodiment to yield a still further embodiment. Thus, it is intended that the present subject matter covers all such modifications and variations within the scope of the appended claims and their equivalents. These and other modifications and variations to the present invention may be practiced by those of ordinary skill in the art, without departing from the scope of the present invention, which is more particularly set forth in the appended claims. Furthermore, those of ordinary skill in the art will appreciate that the foregoing description is by way of example only, and is not intended to limit the invention.

What is claimed is:

1. A method comprising:
inputting an array of pixels, wherein each pixel in the array of pixels comprises a pixel dose, and wherein the array of pixels represents dosage on a surface to be exposed with a plurality of patterns, each pattern in the plurality of patterns comprising an edge;
inputting a target bias;
identifying the edge of a pattern in the plurality of patterns, wherein the edge location may be identified within a fractional portion of each pixel;
for each pixel which is in a neighborhood of the identified edge, calculating a calculated pixel dose such that the identified edge is relocated by the target bias, wherein calculating the calculated pixel dose comprises a simulated effect of a dose change; and
outputting the array of pixels with the calculated pixel doses.

2. The method of claim 1, further comprising exposing the surface with a multi-beam apparatus, using the outputted array of pixels.

3. The method of claim 1 wherein calculating the calculated pixel dose comprises calculating a gradient vector.

4. The method of claim 1 wherein identifying the edge of the pattern comprises calculating a location of the edge using pixel doses of the array of pixels.

5. The method of claim 1 wherein calculating the calculated pixel dose comprises calculating a dose margin for the relocated edge.

6. The method of claim 5 wherein the dose margin is improved by increasing the pixel dose of a pixel near the relocated edge.

7. The method of claim 6 wherein the dose margin is improved to at least a predetermined minimum dose margin.

8. The method of claim 6 wherein the dose margin is maximized, up to a predetermined maximum pixel dose.

9. The method of claim 1 wherein a portion of the calculating is done using a graphics processing unit.

10. The method of claim 1, further comprising:
inputting the plurality of patterns for the surface; and
rasterizing pattern data of the plurality of patterns to create the array of pixels.

11. The method of claim 1 wherein calculating the calculated pixel dose further comprises compensating for a mid-range scattering.

12. A method comprising:
inputting a plurality of patterns to be exposed on a surface, wherein each pattern comprises an edge;
inputting a target bias;
rasterizing the plurality of patterns to create an array of pixels, wherein each pixel in the array of pixels represents an exposure dosage, and wherein a location of the edge may be within a fractional portion of each pixel;
calculating dosages of pixels in the array of pixels, wherein the calculated dosages relocate the edge of a pattern in the plurality of patterns, wherein the relocation is based on the target bias, and wherein calculating the calculated pixel dose comprises a simulated effect of a dose change; and
outputting the array of pixels, including the calculated pixel dosages.

\* \* \* \* \*